US011337309B2

(12) United States Patent
Aoude et al.

(10) Patent No.: US 11,337,309 B2
(45) Date of Patent: May 17, 2022

(54) METHODS OF MANUFACTURING PRINTED WIRE BOARDS

(71) Applicant: Rohm and Haas Electronic Materials LLC, Marlborough, MA (US)

(72) Inventors: Tina Aoude, Medway, MA (US); David Fleming, Northborough, MA (US); Michelle Bowerman Riener, Waltham, MA (US); Colin O'Mara Hayes, Hudson, MA (US); Herong Lei, Acton, MA (US); Robert K. Barr, Shrewsbury, MA (US); David Louis Danza, Rutland, MA (US)

(73) Assignee: ROHM AND HAAS ELECTRONIC MATERIALS LLC, Marlborough, MA (US)

( * ) Notice: Subject to any disclaimer, the term of this patent is extended or adjusted under 35 U.S.C. 154(b) by 255 days.

(21) Appl. No.: 16/814,222

(22) Filed: Mar. 10, 2020

(65) Prior Publication Data

US 2020/0296837 A1    Sep. 17, 2020

Related U.S. Application Data

(60) Provisional application No. 62/816,532, filed on Mar. 11, 2019.

(51) Int. Cl.
*H05K 3/00* (2006.01)
*H05K 3/40* (2006.01)
*H05K 3/42* (2006.01)

(52) U.S. Cl.
CPC ......... *H05K 3/0094* (2013.01); *H05K 3/0026* (2013.01); *H05K 3/0064* (2013.01);
(Continued)

(58) Field of Classification Search
CPC .. H05K 3/0094; H05K 3/0026; H05K 3/0064; H05K 3/4069; H05K 3/426;
(Continued)

(56) References Cited

U.S. PATENT DOCUMENTS 6,701,613 B2 *   3/2004   Iida ..................... H05K 3/108
                                              29/846
6,739,040 B1    5/2004   Nakamura et al.
(Continued)

FOREIGN PATENT DOCUMENTS

JP   2002232137 A   8/2002
JP   2006285178 A   10/2006
(Continued)

OTHER PUBLICATIONS

Dobish et al.; "Synthesis of low-temperature benzocyclobutene cross-linker and utilization" Polym. Chem., 3; Jan. 11, 2012, pp. 857-860.
(Continued)

*Primary Examiner* — Donghai D Nguyen
(74) *Attorney, Agent, or Firm* — Cantor Colburn LLP

(57) ABSTRACT

Disclosed herein is a method of forming vias in electrical laminates comprising laminating a sheet having a layer comprising a crosslinkable polymer composition to a substrate wherein the crosslinkable polymer composition has a viscosity at lamination temperatures in the range of 200 Pa-s to 100,000 Pa-s, forming at least one via in the crosslinkable polymer layer by laser ablation; and after the forming of the at least one via, thermally curing the crosslinkable polymer layer. According to certain embodiments the cross linkable polymer composition has a viscosity at lamination temperature of at least 5000 Pa-s. This method yields good lamina-
(Continued)

tion results, good via profiles, and good desmear results when such compositions are used and the via is laser ablated before cure.

15 Claims, 4 Drawing Sheets

(52) U.S. Cl.
CPC .......... *H05K 3/4069* (2013.01); *H05K 3/426* (2013.01); *H05K 2201/0959* (2013.01)

(58) Field of Classification Search
CPC .. H05K 3/0032; H05K 3/4611; H05K 3/4655; H05K 2201/0959; H05K 1/0346; H05K 2201/012; H05K 1/0373; C09D 125/18; Y10T 29/49155
USPC .......................................... 29/830, 846, 852
See application file for complete search history.

(56) References Cited

U.S. PATENT DOCUMENTS

| | | | |
|---|---|---|---|
| 7,148,128 B2 | 12/2006 | Jacobson | |
| 7,198,878 B2 | 4/2007 | So et al. | |
| 7,208,062 B2 | 4/2007 | Nakamura et al. | |
| 7,166,180 B2 | 6/2007 | Nakamura et al. | |
| 8,076,782 B2* | 12/2011 | Asai | H05K 1/0274 257/774 |
| 8,143,360 B2 | 3/2012 | So et al. | |
| 8,975,732 B2* | 3/2015 | Tojo | H01L 24/19 257/666 |
| 9,148,963 B2 | 9/2015 | Matsuda et al. | |
| 10,141,272 B2* | 11/2018 | Takemura | H01L 25/50 |
| 10,513,568 B2 | 12/2019 | Hayes et al. | |
| 2002/0102494 A1 | 8/2002 | Ohba et al. | |
| 2015/0210793 A1 | 7/2015 | Park et al. | |
| 2016/0042268 A1 | 2/2016 | Puttkammer | |
| 2017/0359908 A1 | 12/2017 | Fujimura et al. | |
| 2019/0127505 A1 | 5/2019 | Hayes et al. | |
| 2019/0127506 A1 | 5/2019 | Hayes et al. | |

FOREIGN PATENT DOCUMENTS

| | | |
|---|---|---|
| JP | 2008001871 A | 1/2008 |
| JP | 2012045887 A | 3/2012 |

OTHER PUBLICATIONS

So et al.; "Styrene 4-Vinylbenzocyclobutene Copolymer for Microelectronic Applications", Journal of Polymer Science: Part A: Polymer Chemistry, vol. 46; Jan. 9, 2008, 2799-2806.

* cited by examiner

METHODS OF MANUFACTURING PRINTED WIRE BOARDS

CROSS REFERENCE TO RELATED APPLICATIONS

This application claims the benefit of U.S. Provisional Application Ser. No. 62/816,532, filed Mar. 11, 2019, the entire disclosure of which is incorporated herein by reference.

FIELD OF THE INVENTION

This disclosure relates to printed wire boards, methods of manufacture thereof and articles comprising the same. More specifically, the disclosure relates to printed wire boards, methods of manufacture thereof and articles comprising the same using lamination and laser ablation.

BACKGROUND

Current methods for the manufacture of printed wire boards may rely on the sequential lamination of polymeric insulating layers with conducting layers. Vias (i.e. holes) are made through the insulating layers by laser ablation or mechanical drilling. The vias are then used to form electrical connections between layers. A current method involves, in exact order, first lamination of the polymeric insulating layer either by hot roll or vacuum lamination processing, then thermal curing in an oven to produce a cross-linked system, and finally via formation by either laser ablation or mechanical drill. See e.g. U.S. Pat. No. 6,739,040. This via formation process is used to ensure each laminated polymeric insulating layer is separately and individually addressable. Within this process, curing of the laminated polymeric insulating layers before laser ablation or mechanical drilling is crucial to avoid via reflow as there is no way of preventing via reflow unless the described steps are followed in this exact order. If reflow occurs, the via side wall profile can be affected and there is a potential for the via to close, hindering or, as a worst case scenario, completely prevent addressability (i.e. prevent forming an interconnect through the via).

This process can be cumbersome as the laminate must be cured repeatedly before via formation. For example, the laminate must be cured at several steps for each layer that is formed individually. There remains a need for a process that is more efficient and versatile for large scale manufacturing.

SUMMARY OF THE INVENTION

Disclosed herein is a method of comprising laminating a sheet having a layer comprising a crosslinkable polymer composition to a substrate wherein the crosslinkable polymer composition has a viscosity at lamination temperatures in the range of 200 Pa-s to 100,000 Pa-s, and the crosslinkable polymer composition comprises a crosslinkable polymer having a weight average molecular weight in the range of about 30,000 to about 150,000 gm/mol as measured by gel permeation chromatography (GPC) using a polystyrene standard; forming at least one via in the crosslinkable polymer composition layer by laser ablation; and after the forming of the at least one via; curing the crosslinkable polymer composition. According to certain embodiments the cross linkable polymer composition has a viscosity at lamination temperature of at least 5000 Pa-s. Surprisingly, applicants have found good lamination results, good via profiles, and good desmear results when such compositions are used and the via is laser ablated before cure.

DETAILED DESCRIPTION OF THE INVENTION

Disclosed herein is a printed wire board that comprises a plurality of layers and that comprises vias that establish electrical contact between the plurality of layers. The vias are devoid of any reflow that may completely or partially prevent addressability between the plurality of layers. Disclosed herein too is a method for manufacturing printed wire boards that prevents reflow between the various layers during or after formation of the via. The method advantageously comprises manufacturing the vias in the plurality of layers prior to curing (or cross-linking) one or more layers to form the printed wire board.

Disclosed herein too is a polymer composition that may be used to manufacture the printed wire board. The polymer composition comprises a crosslinkable polymer. Additional optional components are selected from dielectric filler (including inorganic or organic dielectric fillers), crosslinker, antioxidant, flow modifier, adhesion promoter, flame retardant, and combinations thereof.

Figure 1:
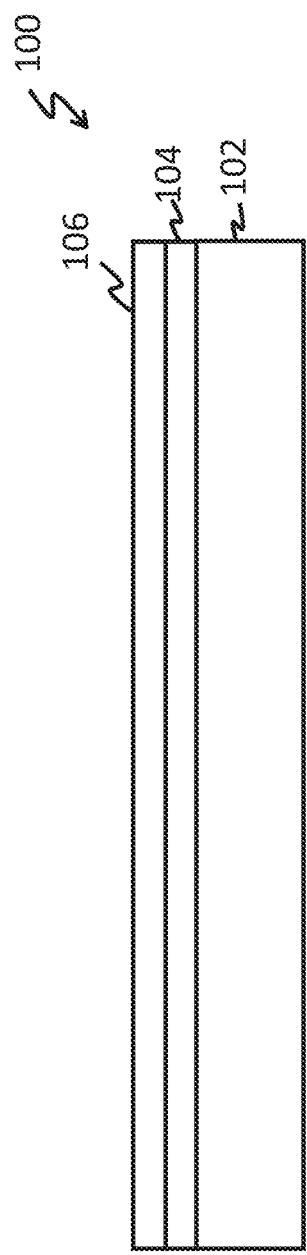
FIG. 1 is a depiction of the laminate.

With reference now to the FIG. 1, a printed wire board 100 comprises a substrate 102, upon which is disposed a crosslinkable polymer layer 104. In an embodiment, one surface of the crosslinkable polymer layer 104 may contact the substrate 102 while an opposing surface contacts a carrier film 106. Printed wire boards can be single-sided (one electrically conducting layer), double-sided (two electrically conducting layers on both sides of one substrate layer), or multi-layer (outer and inner layers of an electrically conducting material, alternating with layers of substrate). The electrically conducting layers comprise copper. Multi-layer printed wire boards allow for much higher component density, because circuit traces on the inner layers would otherwise take up surface space between components.

The substrate 100 can comprise a polymer, a ceramic, a metal, or a combination thereof. The substrate may be rigid or flexible. Suitable polymers for use in the substrate are phenolic paper or phenolic cotton paper, paper impregnated with a phenol formaldehyde resin, a woven fiberglass cloth impregnated with an epoxy resin and/or with a polyester resin, matte glass and polyester, polyimides (e.g., KAPTON®), unfilled polytetrafluoroethylene (e.g., TEFLON®), ceramic filled polytetrafluoroethylene, or the like, or a combination thereof.

Suitable ceramics for use in the substrate include alumina, aluminum nitride, beryllium oxide, or the like. Suitable metals for use in the substrate include copper, aluminum, or a combination thereof. A preferred substrate comprises a woven fiberglass cloth impregnated with an epoxy resin or a derivative of an epoxy resin.

The substrate may have a thickness of at least 50 or at least 75 or at least 100 or at least 150 micrometers and no more than 2500 or 2000 or 1500 micrometers.

In an embodiment, the carrier film 106 may be disposed atop the crosslinked polymer layer 104. The carrier film 106 may be a suitable polymer such as a polyester, for example polyethylene terephthalate.

The Cross-linkable Polymer Composition

Disposed on the substrate 102 is the crosslinkable layer 104, which comprises the crosslinkable polymer composition. The crosslinkable polymer composition is disposed on the substrate as a crosslinkable polymer composition and is subjected to crosslinking using thermal energy after the vias are formed in the printed wire board. The crosslinkable polymer composition also has a viscosity that is high enough to prevent flow as it is heated during the manufacturing of the vias. Nevertheless the crosslinkable polymer composition is such that it conforms to the geometry of the substrate upon being applied to the substrate. According to certain embodiments the crosslinkable composition layer is electrically insulating.

The crosslinkable polymer composition is cured to form a cross-linked polymer composition. Examples of cross-linked polymers are epoxy polymers, unsaturated polyester polymers, polyimide polymers, bismaleimide polymers, bis-maleimide triazine polymers, cyanate ester polymers, benzoxazine polymers, arylcyclobutene-based polymers (e.g. substituted or unsubstituted benzocyclbutene based polymers), acrylics, polyalkyds, phenol-formaldehyde polymers, novolacs, resoles, melamine-formaldehyde polymers, urea-formaldehyde polymers, hydroxymethylfurans, unsaturated polyesterimides, or the like, or a combination thereof. An exemplary polymer used in the crosslinked layer is a polybenzocyclobutene.

According to one embodiment, the crosslinkable polymer composition comprises the partially polymerized reaction product of an addition polymerizable arylcyclobutene monomer. Suitable monomers include one or more addition polymerizable arylcyclobutene-containing monomers A having as a substituent on the arylcyclobutene one or more groups chosen from an alkyl; a heteroatom-containing alkyl, such as a heteroatom-containing alkoxy or alkylthio; an alkenyl; a heteroatom containing alkenyl; an aryl; a heteroatom-containing aryl, such as a heteroatom-containing aryloxy or thioaryl.

Monomer A according to certain embodiments has the structure shown in (1) or (2) below:

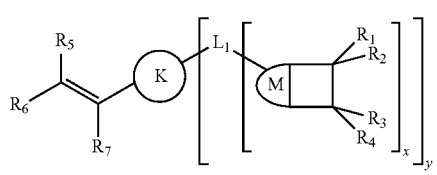

(1)

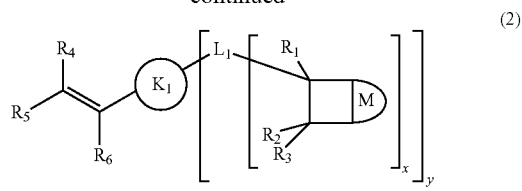

(2)

wherein K and K1 are individually a covalent bond or a divalent group chosen from a C1 to C6 alkyl substituted or unsubstituted divalent aryl group, a C1 to C6 alkyl substituted or unsubstituted divalent heteroaryl group, such as an aryloxy group; a C1 to C30 divalent alkyl group; a C1 to C30 heteroatom containing alkyl group; a divalent C1 to C30 alkylene group, a carbonyl group, an ether group, a thioether group, an ester group, a carboxyl group or a cyano group; M is an aromatic group chosen from a C1 to C6 alkyl substituted or unsubstituted divalent aryl group, a C1 to C6 alkyl substituted or unsubstituted divalent heteroaryl group; and $L_1$ is selected from a covalent bond or is a hydrocarbon linking group having a valence of x+1, preferably, when x is 1, $L_1$ is divalent hydrocarbon group, such as an alkylene group or an alkyl substituted alkylene group, a C1 to C30 heteroatom containing hydrocarbon group, or a C1 to C30 substituted heterohydrocarbyl group; and $R_1$ through $R_7$ are each independently selected from a monovalent group chosen from hydrogen, deuterium, halogen, a C1 to C6 alkyl group, a C1 to C6 alkoxy group, a C1 to C6 alkyl substituted hydrocarbon group, a heteroatom containing hydrocarbon group, a C1 to C6 alkyl substituted heterohydrocarbon group, a cyano group, a C6 to C12 aryl group, a C1 to C6 alkyl substituted aryl group, a heteroaryl group, or a C1 to C6 alkyl substituted heteroaryl group, wherein at least one of $R_1$, $R_2$, $R_3$, and $R_4$ is chosen from a C1 to C6 alkyl group, a C1 to C6 alkoxy group, a C1 to C6 alkyl substituted hydrocarbon group, a heteroatom containing hydrocarbon group, a C1 to C6 alkyl substituted heterohydrocarbon group, a cyano group, a C6 to C12 aryl group, C1 to C6 alkyl substituted aryl group, a heteroaryl group, or a C1 to C6 alkyl substituted heteroaryl group; or, preferably, one or more of $R_1$, $R_2$, $R_3$ and $R_4$ is chosen from a C1 to C6 alkyl group, a C1 to C6 alkoxy group, a C1 to C6 alkyl substituted hydrocarbon group, a heteroatom containing hydrocarbon group, a C1 to C6 alkyl substituted heterohydrocarbon group, a cyano group, an hydroxyl group, an aryl group, C1 to C6 alkyl substituted aryl group, a heteroaryl group, or a C1 to C6 alkyl substituted heteroaryl group; and, x and y are each independently an integer from 1 to 5 wherein y is 1 when $L_1$ is a covalent bond, or, preferably, y is 1 and x is 1 or 2. One or more of $R_1$ to $R_7$ may be the same, particularly, one or more of $R_1$ to $R_4$ may be the same. As used herein, "Cnumber" indicates the number of carbon atoms. So, C1 means one carbon atom, C6 means six carbon atoms, C12 means 12 carbon atoms, C30 means 30 carbon atoms, and the like.

Preferably, the crosslinkable polymer is the polymerized reaction product of one or more of the addition polymerizable arylcyclobutene monomers with an aromatic addition polymerizable second monomer such as styrene, α-methyl styrene, allyloxystyrene, allyl terminated polyarylene ethers or maleimide terminated polyarylene ethers; and optionally one or more additional monomers selected from addition polymerizable third monomers such as acrylates or methacrylates, such as cyclohexyl methacrylate, n-butyl methacrylate, cyclohexyl acrylate and fatty (meth)acrylates;

maleimides and bis-maleimides; cyclic anhydrides, such as maleic anhydride, 3-methylenedihydrofuran-2,5-dione or itaconic anhydride; (meth)acrylates for improving adhesion, such as 2-acryloyloxyethylacid phosphate, trimethoxysilylpropyl methacrylate, 2-[2-hydroxy-5-[2-(methacryloyloxy) ethyl]phenyl]-2H-benzotriazole, 2-(methacryloyloxy)ethyl acetoacetate; allyl group containing monomers for adhesion promotion, such as allyl phosphonates, allyloxyethyl phosphate, or allyloxypropyl trimethoxysilane; linear and branched alkenes, such as hexene; cyclic olefins, such as cyclopentene, cyclohexene or cyclooctene; and/or fourth monomers containing a second dienophile or addition polymerizable group, such as benzocyclobutene (BCB) containing crosslinkers, for example, vinyl benzocyclobutene, or divinylsiloxyl bis-benzocyclobutene (DVS-BCB); allyl methacrylate; divinyl benzene; dienes, such as, butadiene, cyclopentadiene, β-myrcene, ocimene, cyclooctadiene, or tetraphenylcyclopentadienone; allyloxystyrene; vinyl, allyl, or maleimide terminated polyols; oligosiloxanes or polysiloxanes; or maleimide terminated polyimides; preferably, the fourth monomer comprises n-butyl acrylate, cyclohexyl acrylate, cyclohexyl methacrylate or C8 to C20 alkyl (meth) acrylates, such as fatty (meth)acrylates or monomers chosen from a nitrogen heterocycle containing an addition polymerizable fourth monomer, such as N-vinyl pyridine or other vinyl pyridine isomers such as 2-vinyl pyridine, N-vinyl imidazole or other vinyl imidazole isomers such as 4-vinyl imidazole, vinyl triazole, or, optionally, two or more such monomers; or mixtures thereof.

In another embodiment, the crosslinkable polymer composition comprises at least one polymer of, in copolymerized form, a monomer mixture of one or more addition polymerizable arylcyclobutene-containing monomers A having as a cyclobutene ring substituent one or more groups chosen from alkyl and aryl and the polymer compositions further comprise an addition polymerizable crosslinker monomer containing two or more allyl groups, such as triallyl isocyanurate, a diallyl glycol, a diallyl polyether diol, a diallyl polyester diol, preferably, a diallyl aromatic polyester diol, or triallyl benzene.

In another embodiment, the crosslinkable polymer composition comprises, in copolymerized form, a monomer mixture of the one or more arylcyclobutene-containing monomers A, the one or more aromatic addition polymerizable second monomers, such as styrene and the one or more other addition polymerizable monomers chosen from the third monomer, the fourth monomer or both; wherein monomer A has structure 2 or a structure 3 shown below:

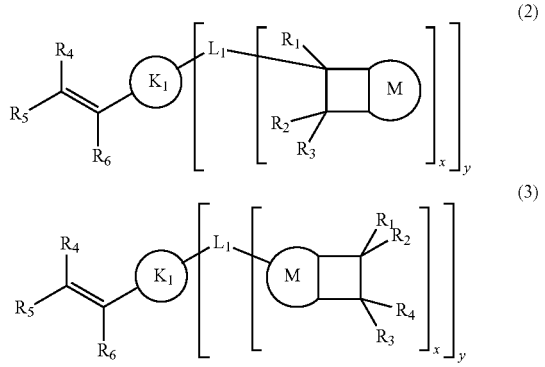

wherein, $K_1$ is a divalent heteroatom containing hydrocarbon group having from 1 to 36 carbon atoms, such as an alkylthio or alkoxy group, for example, a C1 to C6 alkoxy group, or such as an aryloxy group or an arylthio group, for example, an C1 to C6 alkyl substituted or unsubstituted divalent O-heteroaryl group or S-heteroaryl group having from 5 to 36 carbon atoms; a divalent hydrocarbon group having from 5 to 36 carbon atoms, such as an alkyl, alkylene, aryl or alkylaryl group; a cyano group; a carbonyl group; an ester group (—COO—); a carboxyl group (—OOC—); or a divalent heteroatom group, such as an ether group (—O—); or a thioether group (—S—); K2 is a covalent bond or a divalent group chosen from a C1 to C6 alkyl substituted or unsubstituted divalent aryl group, a C1 to C6 alkyl substituted or unsubstituted divalent hydrocarbon group, or a divalent C1 to C30 alkylene group, such as a C1 to C6 alkylene group; a divalent heteroatom containing hydrocarbon group, such as a C1 to C6 alkyl substituted or unsubstituted divalent heteroaryl group, for example, an aryloxy group, an arylthio group, or a C1 to C6 alkyl substituted or unsubstituted divalent O-heteroaryl group or S-heteroaryl group having from 5 to 36 carbon atoms or such as a C1 to C6 alkyl substituted or unsubstituted divalent heteroalkyl group, for example, an alkoxy group, such as a C1 to C6 alkoxy group, or an alkylthio group; an ether group (—O—); or a thioether group (—S), a carbonyl group; an ester group (—COO—); or a cyano group; or, preferably, K2 is a covalent bond; M is a divalent aromatic group chosen from a C1 to C6 alkyl substituted or unsubstituted aromatic radical group, or a C1 to C6 alkyl substituted or unsubstituted divalent heteroaromatic radical group; $L_1$ is a covalent bond or $L_1$ is a linking group, such as a hydrocarbon linking group, having a valence of x+1, or, preferably, is a covalent bond; and, $R_1$ through $R_7$ are each independently selected from a monovalent group chosen from hydrogen, deuterium, halogen, hydroxyl, a C1 to C6 alkyl group, a C1 to C6 alkoxy group, a C1 to C6 alkyl substituted hydrocarbon group, a heteroatom containing hydrocarbon group, a C1 to C6 alkyl substituted heterohydrocarbon group, a cyano group, an hydroxyl group, a monovalent aryl group, a C1 to C6 alkyl substituted aryl group, a heteroaryl group, or a C1 to C6 alkyl substituted heteroaryl group; x and y are each independently an integer from 1 to 5, or, preferably, from 1 to 2, or, more preferably, 1, and wherein y is 1 when $L_1$ is a covalent bond; wherein, when the one or more arylcyclobutene-containing monomers A has the structure 2, each of $R_1$, $R_2$ and $R_3$ is a hydrogen; and, further wherein, when the one or more arylcyclobutene-containing monomers A has the structure 3, $L_1$ is a covalent bond or a hydrocarbon linking group; or, preferably, both, of $L_1$ and K2 are a covalent bonds; and at least one of $R_1$, $R_2$, $R_3$ and $R_4$ is chosen from a C1 to C6 alkyl group; a C1 to C6 alkoxy group; a C1 to C6 alkyl substituted hydrocarbon group having from 5 to 36 carbon atoms; a heteroatom containing hydrocarbon group; a C1 to C6 alkyl substituted heterohydrocarbon group, such as thioalkyl; a cyano group; an aryl group; a C1 to C6 alkyl substituted aryl group, a heteroaryl group, such as aryloxy or thioaryl; or a C1 to C6 alkyl substituted heteroaryl group; or, preferably, at least one of $R_1$, $R_2$, $R_3$ and $R_4$ is a group chosen from a C1 to C6 alkyl group, a C1 to C6 alkoxy group, an aryl group, an aryloxy group, an hydroxyl group, a thioalkyl group, or a thioaryl group.

The crosslinkable polymer composition is characterized in that it is susceptible to good adhesion under the lamination conditions. However, the viscosity must be sufficiently high that it does not reflow during the process of forming the vias, e.g., during laser ablation. Thus, according to certain embodiments the crosslinkable polymer composition has a viscosity of at least 200 or at least 500 or at least 1000 or at least 2000 or at least 5000 Pa-s and less than 100,000, preferably less than 70,000, and more preferably less than 50,000 Pa-s at lamination temperature. Alternatively, the crosslinkable polymer composition has minimum viscosities of at least 200 or at least 500 or at least 1000 or at least 2000 or at least 5000 Pa-s and less than 100,000, preferably less than 70,000, and more preferably less than 50,000 Pa-s or at temperatures in the range of 100 to 160° C. Viscosity may be determined using an oscillation temperature ramping program (10° C./min ramp rate) run on a standard parallel plate rheometer. Surprisingly the inventors saw good conformation to the substrate during lamination with polymer formulations having minimum viscosities of 5000 Pa-s or more.

The crosslinkable polymer composition is generally thermally treated to form the crosslinked layer. The crosslinking is conducted after the vias are drilled into the printed wire board. The drilling of the vias and the crosslinking will be discussed below.

In certain embodiments, the polymer composition may comprise, in copolymerized form, at least 10 or 15 to 90 or 70 wt. % or, of the one or more arylcyclobutene-containing monomers A; from 5 or 20 to 75 or 70 wt. % of the one or more aromatic addition polymerizable second monomer; from 1 or 5 to 30 or 25 wt. % of the one or more addition polymerizable third monomers, such as a (meth)acrylate monomer, the one or more other addition polymerizable monomers which is chosen from the one or more nitrogen heterocycle containing addition polymerizable fourth monomers, or both, wherein all weights are based on the total solids weight of monomers used to make the copolymer with all monomer wt. % s adding to 100%.

In another embodiment, the polymer composition comprises from 10 to 80 wt. %, or, preferably, from 20 to 60 wt. % of polymer solids, based on the total weight of the polymer and the remainder of an organic solvent, such as a polar protic solvent, such as an aliphatic ketone, like 2-butanone; an alkyl glycol ether, such as propylene glycol methyl ether; or a (cyclo)alkanol; cyclic ketones such as cyclopentanone; aromatic ethers such as anisole; or a polar aprotic solvent, such as an alkyl ester, amide or sulfone.

In yet another embodiment, the polymer composition comprises from 1 to 50 wt. %, or, preferably, from 5 to 40 wt. %, or, even more preferably, from 10 to 30 wt. % of formulation solids, based on the total weight of the composition.

Filler

In an embodiment, the polymer composition may include dielectric fillers. The dielectric fillers may include ceramics. It is desirable for the dielectric fillers to be nanometer or micrometer sized fillers. A term prefaced with "nano" has a largest dimension of less than 100 nanometers. Micrometer sized fillers are those having a largest dimension that ranges from 101 nanometers to 5000 nanometers (5 micrometers). Micrometer sized fillers are termed microfillers and are prefaced with the term "micro".

The dielectric fillers may have any shape and can be a 1-dimensional filler (e.g., a nanowire), a 2-dimensional geometry (e.g., a platelet) or a three dimensional geometry (e.g., a spherical particle such as a buckyball). Examples of dielectric filler shapes include wires, tubes, platelets, spheres, ellipsoids, pyramids, cones, or the like, or a combination thereof. The dielectric fillers may be nanowires, nanotubes, nanodots, nanoplatelets, nanorods, nanoparticles that have spherical shapes, nanosheets, microwires, microtubes, microdots, microplatelets, microrods, microparticles that have spherical shapes, microsheets, or the like, or a combination thereof.

In an embodiment, the 1-dimensional fillers and 2-dimensional fillers can have aspect ratios of 5 to 100,000, preferably 10 to 50,000 and more preferably 100 to 5,000.

The dielectric fillers may be a metal oxide, a metal carbide, a metal oxycarbide, a metal nitride, a metal oxynitride, a metal boride, a metal borocarbide, a boronitride, a metal silicide, a metal iodide, a metal bromide, a metal sulfide, a metal selenide, a metal telluride, a metal fluoride, a metal borosilicide, hollow-spherical particles (e.g. hollow spherical silica), core shell structure fillers, organic fillers such as polytetrafluoroethylene or styrene butadiene particles, or the like, or a combination thereof. Examples of dielectric fillers include alumina, magnesia, zirconia, titania, antimony tin oxide, barium titanate, calcium copper titanate, lead titanate, lead magnesium titanate, barium neodymium titanate, lead zirconium titanate, strontium titanate, calcium titanate, boron nitride, hexagonal boron nitride, aluminum nitride, silicon nitride, silicon carbide, silicon dioxide, diamond of natural or synthetic origin, or the like, or a combination thereof. The filler particles can be of the various physical forms of each type listed above and the particles may be hybrids of the materials mentioned and have stoichiometric and non-stoichiometric mixed oxides, nitrides and carbides. More specific examples of these include $Al_2O_3$, AlN, MgO, ZnO, BeO, BN, $Si_3N_4$, SiC, SiO, and $SiO_2$ with mixed stoichiometric and non-stoichiometric combinations. A preferred dielectric filler is spherical silicon dioxide.

These dielectric fillers can also contain reactive surfaces to form intimate covalently bonded hybrid organic-inorganic homogeneous materials. In an embodiment, the inorganic filler particles have been surface treated to introduce surface functional groups that allow for the essentially complete co-reactivity with the organic polymer. The functional groups may comprise at least one of hydroxyl, carboxylic, amine, (meth)acrylate, silane and vinyl groups, or similar and without limitation.

When used, the dielectric fillers may be present in the crosslinkable polymer composition, for example, in an amount of at least 1 or at least 5, or at least 10, or at least 20, or at least 30 up to 80, or up to 75 or up to 70 weight %, based on the total weight of the polymer composition.

Crosslinker

The polymer composition may comprise one or more addition polymerizable crosslinker monomers having a number average molecular weight of 2000 grams per mole or less, or more preferably 1500 grams per mole or less, and containing two or more, or three or more addition polymerizable groups, such as allyl or (meth)acrylate groups, or, more preferably, propoxylated trimethylolpropane triacrylate, tricyclodecanedimethanol diacrylate, triallyl isocyanurate (TAIC), or bis maleimides, such as the bis-maleimide of 2,2,4-trimethyl hexane (BMI-TMH), with the proviso that when the arylcyclobutene-containing monomers A comprise alkyl, aryl or alkyl aryl substituents on the arylcyclobutene ring or linking the arylcyclobutene ring to an addition polymerizable group the addition polymerizable crosslinker monomer comprises two or more allyl groups.

In accordance with the compositions of the present invention, the molar ratio of addition polymerizable groups in the one or more crosslinker monomers to the number molar equivalents of arylcyclobutene groups from the monomers A may range from 0.25:1 to 2.0:1, or, preferably, 0.8:1 to 1.6:1.

In accordance with the present invention, the polymerizable crosslinker monomer comprises from 1 or 5 or 10 wt. % to 50 or 40 or 30 wt. % based on the total weight of the polymer composition.

Adhesion Promoter

In certain embodiments, particularly in accordance with the compositions useful in forming the dry sheet dielectric polymer on carrier can further comprise an adhesion promoter. This may be one or more heteroatom containing molecule having a formula weight of 2000 or less, or more preferably 1500 or less, which are known to assemble onto and passivate a metal surface, with assembly and passivation of a copper surface being most preferable, chosen from:

Nitrogen heterocycles such as pyrrole, pyrazoline, imidazole, triazole, tetrazole, indole, indazole, benzimidazole, and benzotriazole, as well as isomers and analogous molecules substituted with, for example, alkyl or aryl groups, without limitation; addition polymerizable nitrogen heterocycles as a such as N-vinyl pyridine or other vinyl pyridine isomers such as 2-vinyl pyridine, N-vinyl imidazole or other vinyl imidazole isomers such as 4-vinyl imidazole, vinyl triazole; heterocycles containing both nitrogen and sulfur such as pyridinethione, benzothiazole and isomers, triazine trithiol and derivatives thereof; phosphates such as (2-methacryloxyethyl) phosphate; carboxylic acids such as 3-mercaptopropionic acid, 2,2'thiodiacetic acid, lauric acid, steric acid, oleic acid, naphthanoic acid; or other adhesion promoting molecules containing metallic heteroatoms such as tetra ethyl titanate, tetrabutyl titanate, tetra ethylhexyl titanate, tetra butyl zirconate, and tetra propyl zirconate.

In accordance with the present invention, the adhesion promoter preferably comprises from 0.005 or 0.01 to 5 or 0.05 to 1 wt. %, based on the total weight of the composition.

Antioxidant

In certain embodiments, particularly in accordance with the compositions useful in forming the dry sheet dielectric polymer on carrier further comprise one or more primary antioxidants known in the industry to stabilize polymeric systems against oxidative degradation. Antioxidants can be chosen from: hindered phenolic antioxidants such as Irganox 1010, Irganox 1035, Irganox 1076, Irganox 1098, Irganox 1135, Irganox 1141, Irganox 1330, Irganox 1425, Irganox 1520L, Irganox 245, Irganox 259, Irganox 3114, Irganox 3114, Irganox 5057, Irganox 565 from BASF, hindered phenols AO-20, AO-30, AO-40, AO-50, and AO-80 from Amfine Chemical Corporation; Phosphite antioxidatants such as Benefos 1618, Benefos 1626, Benefos 1680 from Mayzo; Phosphonite/Hindered Phenol synergistic antioxidant blends such as Irganox B1171, Irganox B215, Irganox 225, Irganox B501W, Irganox B900, In accordance with the present invention, the antioxidant, utilized as a single component or as a blend of multiple components, comprises from 0.01 or 0.02 to 10 or 5 or 2 wt. % based on the total weight of the composition.

Flame Retardant

In certain embodiments, particularly in accordance with the compositions useful in forming the dry sheet dielectric polymer on carrier further comprise one, or optionally, two or more industry known flame retardant materials. Flame retardant materials are exclusively halogen free, and can be chosen from: phosphorous-based molecules having a formula weight of 2000 or less, or more preferably 1500 or less, such as 9,10-Dihydro-9-oxa-10-phos phaphenanthrene-10-oxide (DOPO), 10-(2,5-Dihydroxyphenyl)-9,10-dihydro-9-oxa-10-phospha phenanthrene-10-oxide (DOPO-HQ), 10-[2-(1,4-Dihydroxynaphthyl)]-9,10-dihydro-9-oxa-10-phosphaphenanthrene-10-oxide (DOPO-NQ), triphenyl phosphate, triethyl phosphate, cresyl diphenyl phosphate, Tetraphenyl ResorClnal bis(diphenyl phosphate); oligomeric phosphorous materials such as Fyrolflex RDP, ADK STAB FP-600, ADK STAB FP-800; metal hydrates such as aluminum trihydrate and magnesium trihydrate; metal phosphinates such as aluminum triphosphinate (Exolit OP 935, Exolit OP 945, Exolit OP 1312); nitrogen heterocyclic molecules and salts thereof, such as melamine, melamine cyanurate, triallyl cyanurate, triallyl isocyanurate, Flamestab NOR116, trimethallyl isocyanurate.

In accordance with the present invention, the flame retardant, utilized as a single component or as a blend of multiple components, preferably comprises from 1 or 2 or 3 to 50 or 20 or 12 wt. %, based on the total weight of the composition.

In an embodiment, the film comprising a crosslinkable polymer composition is laminated to the substrate using known lamination methods. For example, the lamination may occur by placing the layers to be laminated between plates or rollers at temperatures of at least 50° C. but no more than 135° C. Use of a vacuum and pressing force can be helpful. For example, in vacuum lamination using platens or a roll mill, a solid dielectric thin film with a thickness of between 1 and 200 micrometers (μm) supported on a plastic carrier is heated in a vacuum chamber and then pressed onto a substrate with a force of between 0.01 and 5 MPa of pressure.

As noted, the lamination may occur with use of a carrier film such as a polyethylene terephthalate (PET) film. The PET/crosslinkable polymer composition sheet is laminated such that the crosslinkable polymer composition is in contact with the substrate. The PET film may be removed prior to ablation, after ablation, prior to cure, or after cure according to the desired process. Alternatively, the PET film may remain attached.

Following lamination, the crosslinkable polymer composition is subject to laser ablation to form one or more vias into the crosslinked polymer layer or through the crosslinked polymer layer to the substrate. For example, a CO2 laser with a wavelength between 9 and 12 microns, more preferable 9.4 to 10.6 microns, is directed towards the dielectric thin film with sufficient power to remove the material under the beam through either evaporation, sublimation, plasma conversion, physical ejection, or any or all combination of these. For example, a pulse rate of 10 Hz to 250 kHz and a power output of 0.01 Watts to 500 Watts may be used to produce the vias. Spot sizes may be tailored to produce vias with sizes ranging from 40 micrometers up to 150 micrometers. Alternatively, other suitable laser sources can be used, such as a KrF excimer laser with a wavelength of 248 nm, a XeCl excimer laser with a wavelength of 308 nm, a frequency doubled Nd:YAG laser with a wavelength of 532 nm, or a frequency tripled Nd:YAG laser with a wavelength of 355 nm.

The method as disclosed herein provides surprisingly good dimensional integrity in the vias that are formed. For example, a via will have a dimension of a cross section of the via at the top of the surface of the layer of crosslinkable (or after cured crosslinked) polymer composition. The via may be in any shape desired but frequently is substantially circular or oval in cross section. A substantially cylindrical via is useful in many applications. The dimension thus may be a diameter of the via opening or other measure of maximum dimension of the cross section of the via opening. The via will also have a dimension of a cross section of the via at the bottom of the via. According to certain embodiments, the length of the dimension (e.g. the diameter or other measure of maximum dimension of the cross section of the via at or near to the bottom of the via) is at least 50%, 60%, 70%, 75%, 80%, 90% of the dimension at the top of the via.

The cross section dimension of the via (e.g. diameter or width of the via opening) may be any dimension as is desired and as is used or useful in the industry. For examples, the via may have a cross section of at least 50 or 60 or 70 microns and no more than 200 or 180 or 150 microns. The via depth according to certain embodiments may be the entire thickness of the crosslinkable (or cross linked after cure) layer. The via may have a depth of, for example, at least 1, 5, 10, 20, 30, 40 or 50 microns. The via may have a depth of, for example, less than 300 or 250 or 200 or 150 microns.

Optionally, additional processing may then occur, such as filling the vias and adding additional layers, repeating the lamination step and ablation to form another layer, and the like. Or the article may be cured before undertaking such additional processing.

After the laser ablation, the article is thermally cured. Cure temperatures are at least 140° C., preferably at least 150, and more preferably at least 160° C., and no more than 230° C., preferably no more than 220 and more preferably no more than 200° C. The cure atmosphere for the preferred polymer may be ambient air or nitrogen. Cure time may be at least 20 minutes, more preferably at least 30 minutes, or at least 40 minutes but preferably no more than 240 minutes, more preferably no more than 120 minutes, yet more preferably no more than 90 minutes, or no more than 60 minutes.

EXAMPLES

Examples 1-7

Polymers A-D were made by reacting the monomers listed in Table 1 in a 100 ml EasyMax™ 402 Basic Synthesis Workstation (Mettler Toledo, Columbia, Md.) reactor equipped with polytetraflouroethylene (Teflon™ polymer, Dupont) coated thermocouple and an overhead mechanical stirrer. Cyclopentanone and monomers listed in Table 1 were charged to the reactor with stirring, and the reactor was heated to 80° C. In a separate 50 ml glass syringe, a solution of cyclopentanone and V65 initiator (Wako Chemical) was charged and added drop-wise to the reactor using a syringe pump over a 12 hour period, after which the reactor was held at 80° C. for an additional 3 hours. After completion, the reactor was cooled to room temperature and the resulting polymer solution was poured into a glass jar.

TABLE 1

Polymer components in weight percent.

|  | Polymer A | Polymer B | Polymer C | Polymer D |
|---|---|---|---|---|
| Styrene alpha methyl 4-vinyl benzocyclobutene | 41.6% | 36.3% | 47.8% | 38.5% |
| Vinyl phenoxy-benzocyclobutene | 40.4% | 46.5% | 47.1% | 29.6% |
| 4-vinyl pyridine | 7.6% | 7.3% | 0.0% | 8.6% |
| butyl acrylate | 10.3% | 9.9% | 5.0% | 23.3% |
| Polymer Mw (g/mol) | 36000 | 48000 | 86000 | 81000 |
| Polymer Mn (g/mol) | 10000 | 20000 | 10000 | 30000 |

Polymer compositions for Examples 1-6 were then formulated as set forth in Table 2 with all numbers being parts by weight by adding all components to a jar and mixing. The weight average molecular weight of each of Polymers A, B, C, and D is greater than 30,000 g/mol. To produce samples for the determination of viscosity properties, the compositions were coated directly onto a glass plate using a 5 mil stainless steel drawdown bar and then dried in a convection oven at 105° C. for 10 min to remove solvent, after which time they were scraped off the plate using a razor blade and loaded in to an Ares G2 parallel plate rheometer purchased from TA Instruments. To produce samples for determination of glass transition temperature, compositions were coated onto PET films using a 5 mil stainless steel draw down bar and then dried in a convection oven at 105° C. for 10 min to remove the solvent. The produced films were vacuum laminated onto silicon wafers bearing a thinly sputtered layer of deposited Cu, and the thermally cured in a convection oven at 180° C. for 1 hour for Examples 1-5 and 220° C. for 1 hour for Example 6. Once cured, the PET was removed and the resulting structures were soaked in a 10% ammonium persulfate bath to dissolve the sputtered Cu layer and release the crosslinked polymer film. The released polymer films were trimmed to 10 mm width and loaded in to a Q800 Dynamic Mechanical Analyzer purchased from TA Instruments. The data is in Table 3.

TABLE 2

|  | Example 1 | Example 2 | Example 3 | Example 4 | Example 5 | Example 6 | Example 7 |
|---|---|---|---|---|---|---|---|
| Polymer A | 27.195 | 27.195 | 26.04 |  |  |  |  |
| Polymer B |  |  |  | 26.3375 |  |  |  |
| Polymer C |  |  |  |  | 21.4375 | 23.3975 |  |
| Polymer D |  |  |  |  |  |  | 20.65 |
| AO | 0.175 | 0.175 | 0.175 | 0.175 | 0.175 | 0.175 | 0.1575 |
| FM1 |  |  |  |  |  |  | 0.1575 |
| FM2 |  |  |  |  | 0.1225 | 0.1225 |  |
| CL A | 7.63 | 7.63 | 8.785 | 8.4875 | 9.73 | 7.77 |  |
| CL B |  |  |  |  |  |  | 6.65 |
| CL C |  |  |  |  |  |  | 2.926 |
| CL D |  |  |  |  |  |  | 1.4 |
| CL E |  |  |  |  |  |  | 0.35 |
| AP1 |  |  |  |  |  |  | 1.575 |
| AP2 |  |  |  |  | 0.035 | 0.035 |  |
| FR1 |  |  |  |  | 3.5 | 3.5 |  |
| FR2 |  |  |  |  |  |  | 1.134 |
| S1 | 65 |  | 65 |  |  |  |  |
| S2 |  | 65 |  |  |  |  |  |
| S3 |  |  |  |  |  |  | 65 |
| S4 |  |  |  | 65 | 65 | 65 |  |

TABLE 2-continued

|    | Example 1 | Example 2 | Example 3 | Example 4 | Example 5 | Example 6 | Example 7 |
|----|-----------|-----------|-----------|-----------|-----------|-----------|-----------|
| L1 |           |           |           |           |           |           | 34        |
| L2 |           |           |           |           |           |           | 60        |
| L3 | 100       | 100       | 100       | 100       | 8         | 8         |           |
| L4 |           |           |           |           | 46        | 48        |           |

Where AO is Irganox 1010 Pentaerythritol tetrakis(3,5-di-tert-butyl-4 hydroxyhydrocinnamate Antioxidant from BASF,
FM1 is TEGOFlow 370 polyacrylate resin Flow Modifier from Evonik,
FM2 is Modaflow Resin polyacrylate resin Flow Modifier from Allnex,
CL A is SR833S is tricyclodecanedimethanol diacrylate Crosslinker from Sartomer,
CL B is TAIC triallyl isocyanurate, 1,3,5-Triazine-2,4,6(1H, 3H,5H)-trione, 1,3,5-tri-2-propen-1-yl-Crosslinker from Evonik,
CL C is BAC45 Hydroxy-terminated polybutadiene diacrylate Crosslinker from Osaka Organic Chemical Industry Ltd,
CL D is SA9000 methylmethacrylate capped polyphenylene ether resin crosslinker from Sabic,
CL E is SR492 propoxylated trimethylolpropane triacrylate crosslinker from Sartomer,
AP1 is SR9012 2-Propenoic acid, 2-ethyl-2-[[(1-oxo-2-propenyl)oxy]methyl]-1,3-propanediyl ester Adhesion Promoter from Sartomer,
AP2 is BZT 1,2,3-Benzotriazole Adhesion Promoter from JOHOKU CHEMICALS,
FR1 is Exolit OP945TP aluminum diethylphosphinate Flame Retardant from Clariant AG,
FR2 is Fyrolflex RDP Resorcinol bis (diphenyl phosphate) Flame Retardant from ICL-IP,
S1 is 0 0.5 umSV-C6 (vinyl) Trimethoxy(vinyl)silane surface treated silica, 0.5 um average diameter, 5 um upper cut from Admatechs,
S2 is 0.5 umSV-C8 (hexyl vinyl) 7-Octenyltrimethoxysilane surface treated silica, 0.5 um average diameter, 5 um upper cut from Admatechs,
S3 is 0.3 umSV-C3 Mineral filler (Trimethoxy(vinyl)silane surface treated silica, 0.3 um average diameter, 1 um upper cut) from Admatechs,
S4 is SC2050-MTM Mineral filler [3-Methacryloyloxy)propyl]trimethoxysilane surface treated silica, 0.5 um average diameter, 5 um upper cut from Admatechs,
L1 is Butyl Acetate,
L2 is Pentanone,
L3 is Cyclopentanone,
L4 is 2-Butanone,

TABLE 3

| Example # | 1 | 2 | 3 | 4 | 5 | 6 | 7 |
|-----------|---|---|---|---|---|---|---|
| Viscosity @ 120° C., Pa * s | 12,500 | 19,800 | 5,000 | no data | 9,970 | 7,890 | 60,600 |
| min viscosity Pa * s (temp, ° C.) | 10,500 (129) | 10,100 (145) | 2,860 (142) | no data | 8,310 (137) | 6,480 (139) | 44,000 (149) |
| Tg, ° C. (DMA) | 167 | 167 | 165 | 173 | 171 | 170 | 182 |

Each example of polymer composition as coated on PET was laminated to a copper clad glass-epoxy circuit substrate using a Meiki MVLP-500/600 vacuum laminator using an upper and lower platen temperature of 120° C., a pressure of 0.85 MPa, and with a vacuum time of 60 s (seconds) and pressure time of 60 s. Each Example was ablated using a $CO_2$ laser with a wavelength of 9.6 μm, operated at a power output of 0.75 W, with a pulse rate of 300 Hz and an aperture size of 115 μm to form a via, and then cured for 1 hour a 180° C. for examples 1-6 and at 220° C. for Example 7. For samples 1-4 the PET carrier layer was removed before ablation and a certain amount of surface damage due to laser reflection was observed but the vias remained open. For Examples 5-7, the PET remained attached during ablation and little to no surface damage was observed.

Example 8 and Comparative Example A

Figure 2:
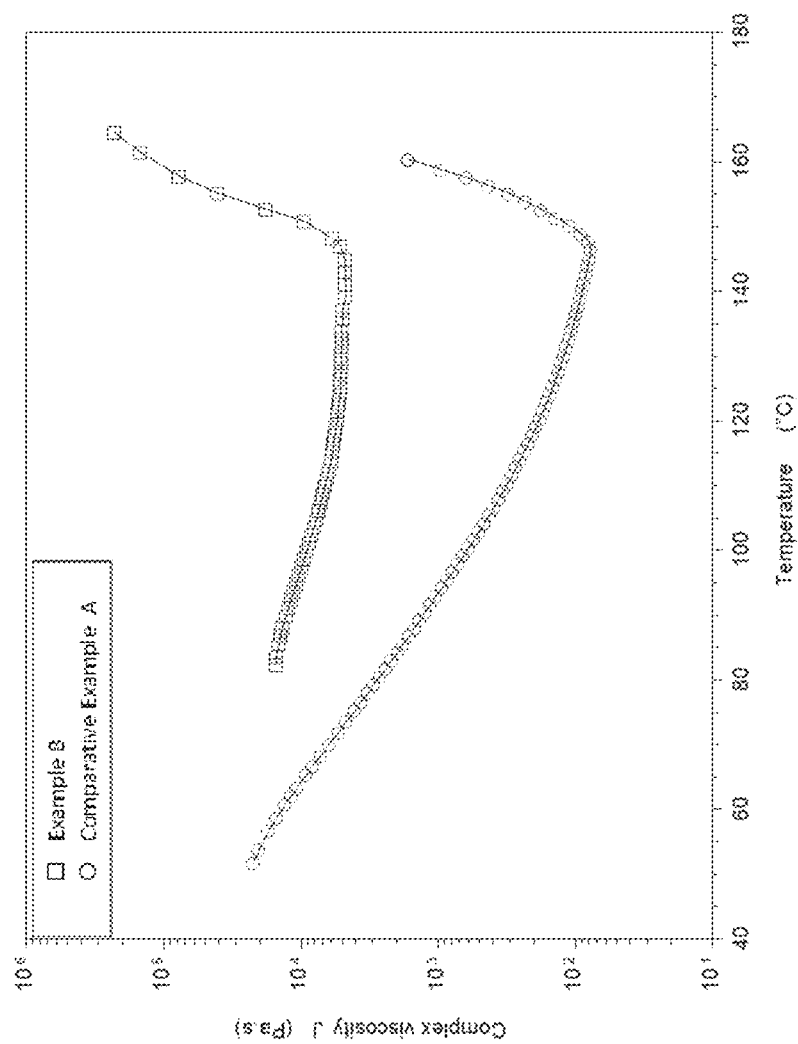
FIG. 2. is a plot of the complex viscosity of the polymer of Example 8 and Comparative Example A.

Two styrene benzocyclobutene polymer formulations were prepared according to the formulation set out in Table 4. Samples for viscosity measurements were produced by drawing down the liquid material onto glass plates using the 6 mil bar stainless steel drawdown bar. After soft baking the material at 120° C. for 10 minutes in a conventional oven to remove solvent, the material was scraped off of the glass with a blade. The resulting solid material was loaded on to an Ares G2 parallel plate rheometer (TA instrument). The results are shown in FIG. 2.

TABLE 4

|  | Example 8 | Comparative Example A |
|--|-----------|----------------------|
| Polymer C | 21.44 | 45.94 |
| AO | 0.18 | 0.38 |
| FM2 | 0.123 | 0.263 |
| CLA | 9.73 | 20.85 |
| AP2 | 0.035 | 0.075 |
| FR1 | 3.5 | 7.5 |
| S4 | 65 | 25 |
| L3 | 5.25 | 5.4 |
| L4 | 29.8 | 30.6 |
| Viscosity@ 120° C., Pa-s | 5400 | 180 |
| Minimum viscosity in Pa-s at (temp in ° C.) | 4700 (143) | 150 (146) |

Dielectric dry film samples for laser ablation were produced by drawing down the liquid material onto polyethylene terephthalate (PET) sheets using the 6 mil stainless steel draw down bar. The films were soft baked at 120° C. for 10 minutes in a conventional oven to produce dielectric dry films supported on PET. These dielectric dry films were then laminated onto chemically roughened copper clad laminate circuit boards using the Meiki laminator. Both platens were heated to 120° C., vacuum was pulled for 60 s, followed by application of 0.85 MPa pressure for 60 seconds. The assembled test coupons were then ablated using a $CO_2$ laser using the following conditions:
Frequency (LRR): 200 Hz,
Pulses: 10 (lop) and 20 (20 p),
Pulse Duration: 2 us, Laser Power: 1.9 W,
Spot mask size: 50 um
Laser wavelength: 9.8 um.

Figure 3B:
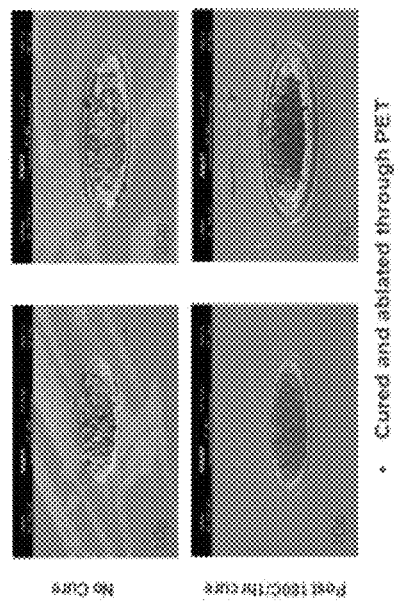
FIG. 3(B) depicts scanning electron microscopy (SEM) images of laminates having a via made according to Comparative Example A of Example 8.
Figure 3A:
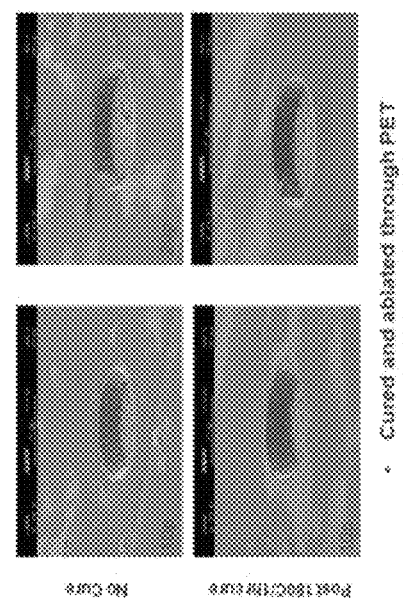
FIG. 3(A) depicts scanning electron microscopy (SEM) images of laminates having a via made according to the process as disclosed herein in Example 8.

After laser ablation, the coupons were cured at 180° C. for 1 hour in a convection oven. After the cure cycle, the PET was removed and the coupons were imaged using Scanning Electron Microscopy (SEM). (See FIG. 3). Reflow is seen in the lower viscosity Comparative example (FIG. 3(B)) but not for Example 8 (FIG. 3(A)).

Example 9 and Comparative Example B

Figures 4A, 4B:
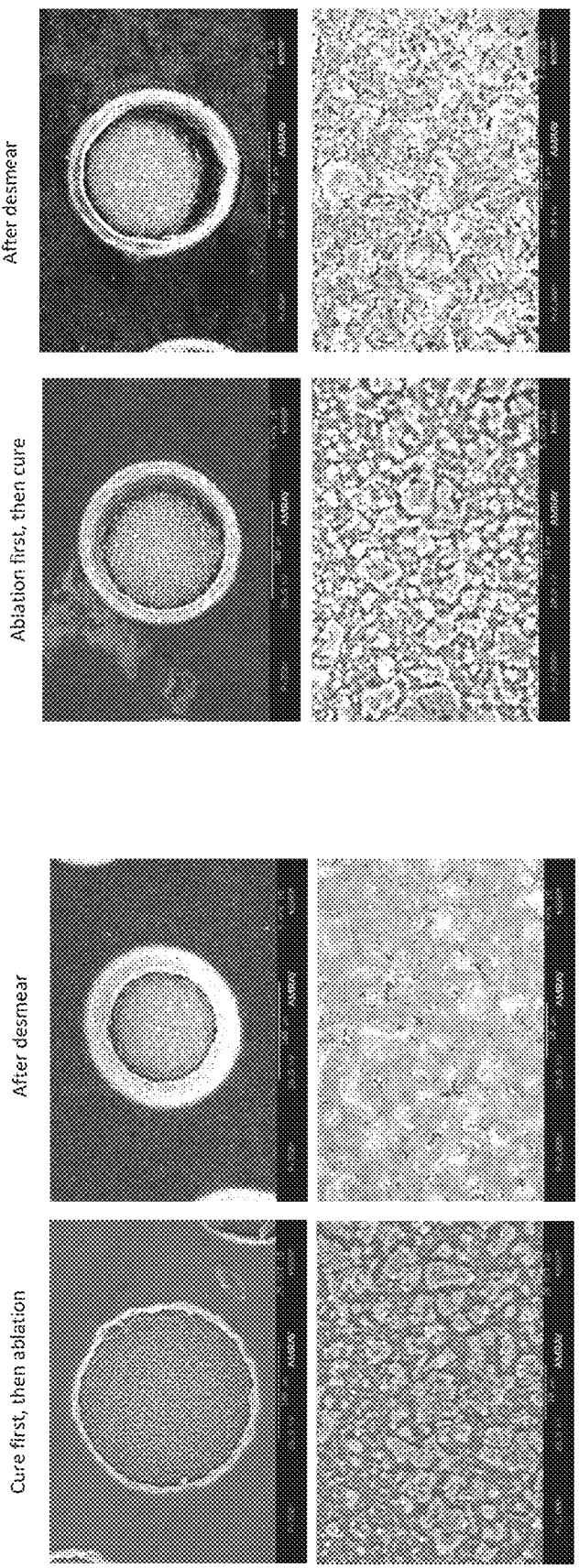
FIG. 4(A) depicts scanning electron microscopy (SEM) images as discussed in the Comparative Example B of Example 9.
FIG. 4(B) depicts scanning electron microscopy (SEM) images of laminates having a via made according to the process as disclosed herein in Example 9.

Two samples of composition identical to Example 5 above were prepared and coated on a PET substrate and laminated as described above. Example 9 was laser ablated as described above and then cured at 180° C. for 1 hour. Comparative Example B was cured at 180° C. for 1 hour and then laser ablated as described above. The samples were then tested for desmear effectiveness using the Circuposit' desmear chemical baths from DuPont's Electronics and Imaging business or an affiliate using process parameters described in Table 5. Ablated samples were dipped sequentially into each process bath for the prescribed time at the prescribed temperature. In between each process bath step, samples were rinsed with room temperature water for 2 min to remove any residual bath chemistry. Samples were then dried and imaged using Scanning Electron Microscopy (SEM) to determine the amount of residue remaining at the bottom of the via after processing. As shown in FIG. 4(A) (Comparative B) and FIG. 4(B) (Example 9), Example 9, which was ablated before cure, showed better performance as indicated by a decreased amount of residue at the bottom of the via as compared the increased amount of residue at the bottom of the via for Comparative B.

TABLE 5

| Generic Process Bath ID | Process Bath Trade Name | Dwell Time, min | Operating Temperature, ° C. |
| --- | --- | --- | --- |
| Sweller | Circuposit ™ MLB Conditioner 211A | 10 | 60 |
| PerMn | Circuposit ™ MLB Promoter 3308 | 20 | 80 |
| Neutralizer | Circuposit ™ MLB Neutrilizer 216-5 | 5 | 45 |
| Micro Etch | Preposit ™ Etch 748 | 2 | Room Temperature |

What is claimed is:

1. A method comprising:
   laminating a sheet having a layer comprising a crosslinkable polymer composition to a substrate wherein the crosslinkable polymer composition has a viscosity at lamination temperatures in a range of 200 Pa-s to 100,000 Pa-s and wherein the crosslinkable polymer composition comprises a crosslinkable polymer having a weight average molecular weight in a range of 30,000 to 150,000 g/mol,
   forming at least one via in the crosslinkable polymer composition layer by laser ablation; and
   after the forming of the at least one via, curing the crosslinkable polymer composition layer.

2. The method of claim 1, wherein the laminating occurs at a temperature of 90 to 135° C. and the curing occurs at a temperature of 140 to 200° C.

3. The method of claim 1, wherein the cross-linkable polymer composition has a minimum viscosity of at least 1000 Pa-s in the temperature range of 100 to 160° C.

4. The method of claim 1, wherein the viscosity at lamination temperatures is in the range of 5000 Pa-s to 60,000 Pa-s.

5. The method of claim 1, wherein the crosslinkable polymer composition comprises a crosslinkable polymer which is a reaction product of a reaction mixture comprising at least one addition polymerizable arylcyclobutene monomer.

6. The method of claim 5 wherein the at least one addition polymerizable arylcyclobutene monomer has a structure (1) or (2) or a combination of monomers of structure (1) and/or (2) is used

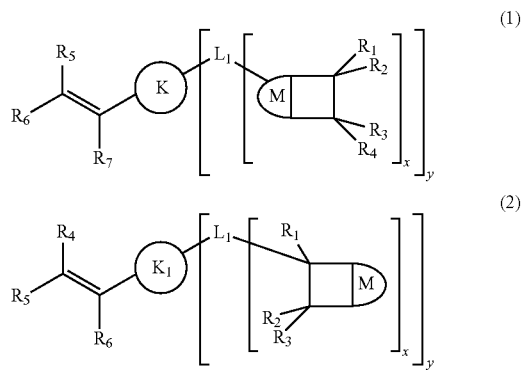

wherein K is a covalent bond or a divalent group chosen from a C1 to C6 alkyl substituted or unsubstituted divalent aryl group, a C1 to C6 alkyl substituted or unsubstituted divalent heteroaryl group, such as an aryloxy group; a C1 to C30 divalent alkyl group; a C1 to C36 heteroatom containing alkyl group; a divalent C1 to C30 alkylene group, a carbonyl group, an ether group, a thioether group, an ester group, or a cyano group; M is an aromatic group chosen from a C1 to C6 alkyl substituted or unsubstituted divalent aryl group, a C1 to C6 alkyl substituted or unsubstituted divalent heteroaryl group; and $L_1$ is selected from a covalent bond or is a hydrocarbon linking group having a valence of x+1, preferably, when x is 1, $L_1$ is divalent hydrocarbon group, such as an alkylene group or an alkyl substituted alkylene group, a C1 to C30 heteroatom containing hydrocarbon group, or a C1 to C30 substituted heterohydrocarbyl group; and $R_1$ through $R_7$ are each independently selected from a monovalent group chosen from hydrogen, deuterium, halogen, a C1 to C6 alkyl group, a C1 to C6 alkoxy group, a C1 to C6 alkyl substituted hydrocarbon group, a heteroatom containing hydrocarbon group, a C1 to C6 alkyl substituted heterohydrocarbon group, a cyano group, a C6 to C12 aryl group, a C1 to C6 alkyl substituted aryl group, a heteroaryl group, or a C1 to C6 alkyl substituted heteroaryl group, wherein at least one of $R_1$, $R_2$, $R_3$, and $R_4$ is chosen from a C1 to C6 alkyl group, a C1 to C6 alkoxy group, a C1 to C6 alkyl substituted hydrocarbon group, a heteroatom containing hydrocarbon group, a C1 to C6 alkyl substituted heterohydrocarbon group, a cyano group, a C6 to C12 aryl group, C1 to C6 alkyl substituted aryl group, a heteroaryl group, or a C1 to C6 alkyl substituted heteroaryl group; and, x and y are each independently an integer from 1 to 5 wherein y is 1 when $L_1$ is a covalent bond.

7. The method of claim 6, wherein the reaction mixture further comprises a monomer selected from the group consisting of benzocyclobutene (BCB) containing crosslinkers; allyl methacrylate; divinyl benzene; dienes; allyloxystyrene; vinyl, allyl, or maleimide terminated polyols; polysiloxanes; or maleimide terminated polyimides.

8. The method of claim 5, wherein the reaction mixture further comprises a second aromatic addition polymerizable monomer selected from the group consisting of styrene, α-methyl styrene, allyloxystyrene, allyl terminated polyarylene ethers or maleimide terminated polyarylene ethers.

9. The method of claim 5, wherein the reaction mixture further comprises an addition polymerizable third monomer selected from the group consisting of acrylates or methacrylates; maleimides and bis-maleimides; cyclic anhydrides; allyl group containing monomers; linear and branched alkenes.

10. The method of claim 1, wherein the crosslinkable polymer composition further comprises one or more of a crosslinker, an antioxidant, an inorganic filler, a flow modifier, an adhesion promoter, and a flame retardant.

11. The method of claim 1, wherein the layer comprising the crosslinkable polymer composition is on a carrier layer.

12. The method of claim 11, wherein the carrier layer is not removed prior to the laser ablation.

13. The method of claim 11, wherein the layer comprising the crosslinkable polymer composition is coated on the carrier layer from a solvent and heated to remove at least some of the solvent.

14. The method of claim 11, wherein the via has a dimension defining an open space at a bottom of the via which is at least 70% of a dimension at the top of the via defining an open space.

15. The method of claim 11, wherein the laminating and forming vias are repeated before the curing is conducted.

* * * * *